(12) United States Patent
Lee

(10) Patent No.: US 10,847,749 B2
(45) Date of Patent: Nov. 24, 2020

(54) LIGHTING APPARATUS USING ORGANIC LIGHT EMITTING DIODE

(71) Applicant: LG Display Co., Ltd., Seoul (KR)

(72) Inventor: JungHyoung Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/711,229

(22) Filed: Dec. 11, 2019

(65) Prior Publication Data

US 2020/0194722 A1  Jun. 18, 2020

(30) Foreign Application Priority Data

Dec. 18, 2018 (KR) .......................... 10-2018-0163997

(51) Int. Cl.
*H01L 51/52* (2006.01)

(52) U.S. Cl.
CPC ...... *H01L 51/5253* (2013.01); *H01L 51/5212* (2013.01); *H01L 51/5228* (2013.01)

(58) Field of Classification Search
CPC ............ H01L 51/5253; H01L 51/5212; H01L 51/5228
See application file for complete search history.

(56) References Cited

U.S. PATENT DOCUMENTS

| | | | |
|---|---|---|---|
| 8,164,253 B2 * | 4/2012 | Abe ............... | H01L 51/5253 313/504 |
| 2018/0047790 A1 * | 2/2018 | Chae .............. | H01L 51/5281 |
| 2019/0103572 A1 * | 4/2019 | Park .............. | H01L 51/5281 |

* cited by examiner

*Primary Examiner* — Telly D Green
*Assistant Examiner* — Andre C Stevenson
(74) *Attorney, Agent, or Firm* — Polsinelli PC

(57) ABSTRACT

A lighting apparatus using an organic light emitting diode comprises a first anode and a second anode respectively disposed in an emission zone and a non-emission zone of an emission area defined at a substrate; a first insulating layer disposed on the second anode; an organic layer and a primary cathode disposed on the first anode; a secondary cathode disposed on the insulating layer and laterally connected to the primary cathode; and an encapsulating material disposed above the substrate, wherein the organic layer is disposed only between the primary cathode and the secondary cathode in the emission zone.

14 Claims, 12 Drawing Sheets

LIGHTING APPARATUS USING ORGANIC LIGHT EMITTING DIODE

CROSS REFERENCE TO RELATED APPLICATION

This application claims the priority of Korean Patent Application No. 10-2018-0163997 filed on Dec. 18, 2018, which is hereby incorporated by reference in its entirety.

BACKGROUND

Field of the Disclosure

The present disclosure relates to a lighting apparatus, and more particularly, to a lighting apparatus using an organic light emitting diode.

Description of the Background

Currently, fluorescent lamps or incandescent lamps are used as lighting apparatuses. Among them, the incandescent lamps have a good color rendering index (CRI), but have low energy efficiency. Further, the fluorescent lamps have high energy efficiency, but have a low color rendering index and contain mercury, which may cause an environmental problem.

The color rendering index is an index representing color reproduction. In other words, the color rendering index represents how much a feeling of a color of an object illuminated by a specific light source is similar to a feeling of a color of the object illuminated by a reference light source. A CRI of sunlight is 100.

In order to solve the problems of the lighting apparatus of the related art, recently, a light emitting diode (LED) is suggested as a lighting apparatus. The light emitting diode is formed of an inorganic light emitting material. A luminous efficiency of the light emitting diode is the highest in the red wavelength range and the luminous efficiency thereof is lowered toward a green wavelength range which has the highest visibility together with the red wavelength range. Therefore, there is a disadvantage in that when a red light emitting diode, a green light emitting diode, and a blue light emitting diode are combined to emit white light, the luminous efficiency is lowered.

As another alternative, a lighting apparatus using an organic light emitting diode (OLED) has been developed. In a lighting apparatus using an organic light emitting diode, an anode formed of ITO is formed on a glass substrate. Further, an organic layer and a cathode are formed on an anode and a protective layer and a lamination film are formed thereon to manufacture the lighting apparatus.

Currently, since the organic layer is formed on a front surface of the substrate, the lighting apparatus using an organic light emitting diode is vulnerable to foreign matters generated when the cathode is patterned or moisture permeation by the foreign matter. That is, the organic layer which is patterned on the entire surface of the substrate serves as a penetrating path of the foreign matter or moisture generated when the cathode is patterned, which results in intercellular moisture permeation and dark spot transition.

SUMMARY

The present disclosure provides a lighting apparatus using an organic light emitting diode which blocks intercellular moisture permeation and dark spot transition by the organic layer.

The present disclosure provides a lighting apparatus using an organic light emitting diode which increases an optical efficiency by the cathode.

The present disclosure is to apply the lighting apparatus to a single-side light emitting transparent lighting apparatus and a double-side light emitting transparent lighting apparatus.

Aspects of the present disclosure are not limited to the above-mentioned objects, and other objects, which are not mentioned above, can be clearly understood by those skilled in the art from the following descriptions.

According to an aspect of the present disclosure, a lighting apparatus using an organic light emitting diode includes: an anode disposed in an emission area of a substrate; an insulating layer disposed on the anode of a non-emission zone of the emission area; an organic layer and a primary cathode disposed on an anode of an emission zone of the emission area; a secondary cathode which is disposed on the insulating layer and is laterally connected to the primary cathode; and an encapsulating unit disposed above the substrate, in which the organic layer is limitedly disposed in the emission zone by the primary cathode and the secondary cathode.

According to another aspect of the present disclosure, a lighting apparatus using an organic light emitting diode includes: a first anode disposed in an emission zone of a substrate; a second anode disposed in a non-emission zone of the substrate; an insulating layer on the second anode to cover the entire second anode and a part of the first anode; an organic layer and a primary cathode which are sequentially disposed on the first anode; a secondary cathode which is disposed on the insulating layer and is laterally connected to the primary cathode; and an encapsulating unit disposed above the substrate, in which the organic layer is limitedly disposed in the emission zone by the primary cathode and the secondary cathode to block intercellular moisture permeation and dark spot transition due to the organic layer.

Other detailed matters of the exemplary aspects are included in the detailed description and the drawings.

According to the present disclosure, intercellular moisture permeation and dark spot transition due to a defective cathode are blocked, thereby improving the reliability.

According to the present disclosure, a secondary cathode is formed of a reflective material to guide light emitted from the organic layer, thereby enhancing an optical efficiency.

The present disclosure may be applied not only to a general lighting apparatus, but also a single-side light emitting transparent lighting apparatus and a double-side light emitting transparent lighting apparatus.

The effects according to the present disclosure are not limited to the contents exemplified above, and more various effects are included in the present specification

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
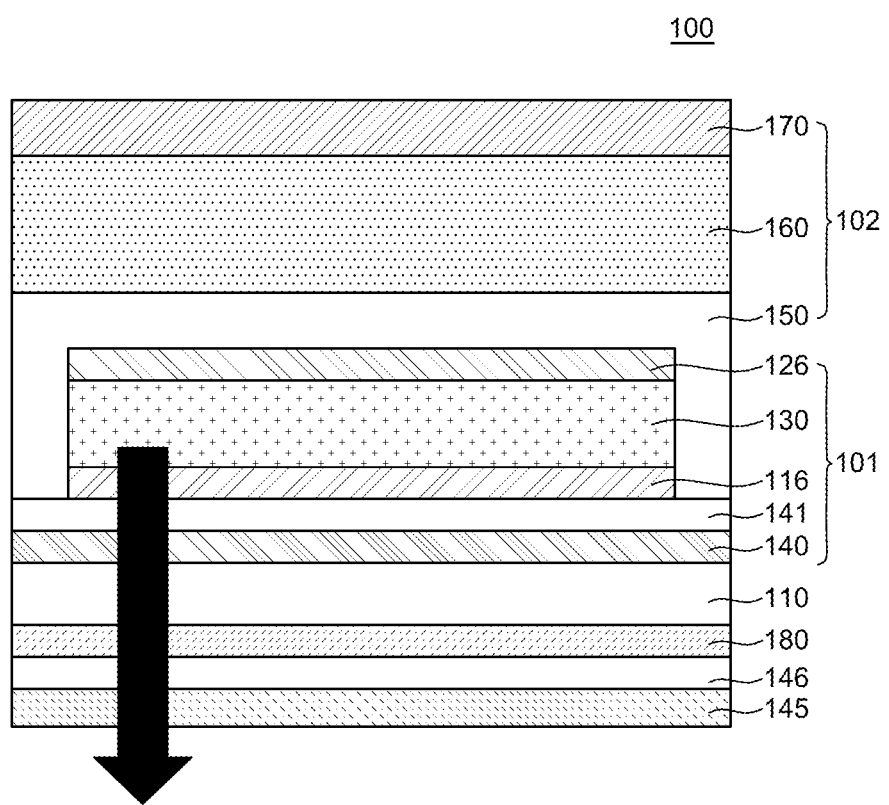
FIG. 1 is a cross-sectional view exemplarily illustrating a lighting apparatus using an organic light emitting diode according to a first exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, various exemplary aspects of the present disclosure will be described in detail with reference to accompanying drawings.

FIG. 1 is a cross-sectional view exemplarily illustrating a lighting apparatus using an organic light emitting diode according to a first exemplary aspect of the present disclosure.

Figure 2:
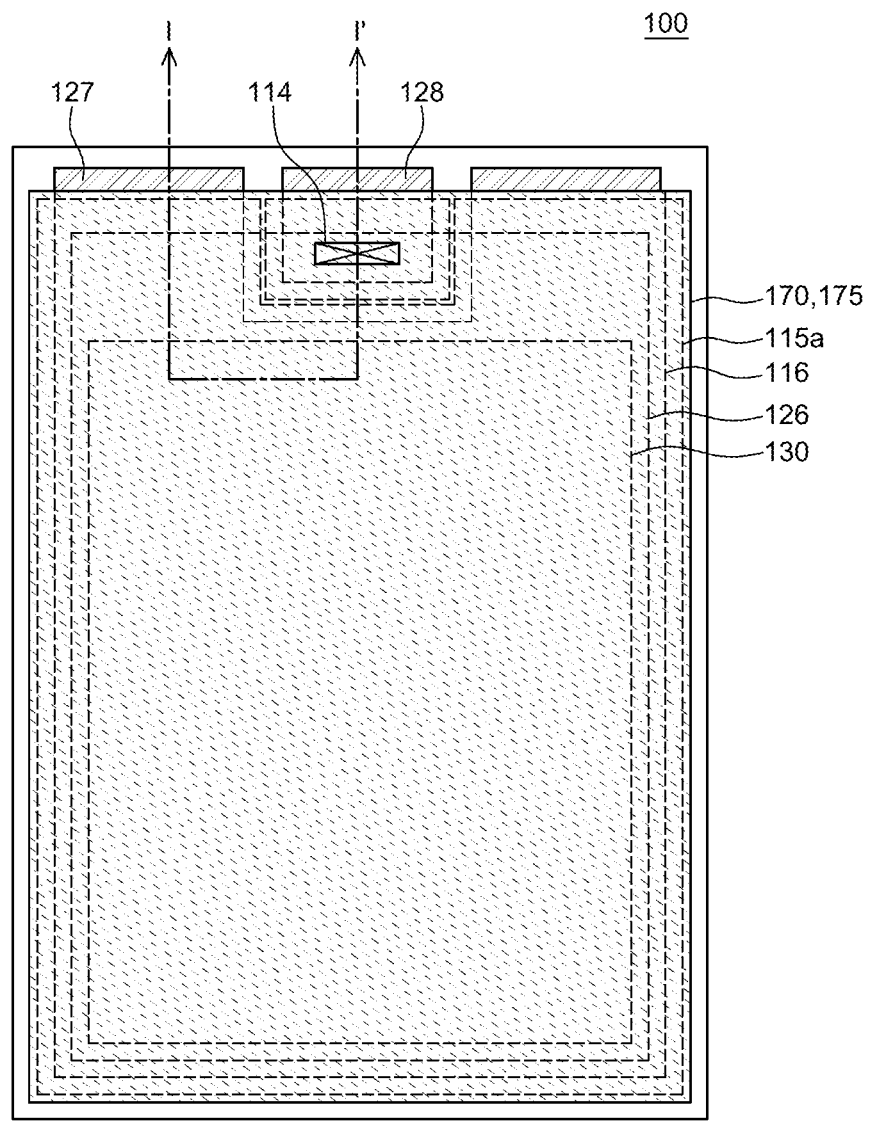
FIG. 2 is a plan view schematically illustrating a lighting apparatus using an organic light emitting diode according to a first exemplary aspect of the present disclosure.

FIG. 2 is a plan view schematically illustrating a lighting apparatus using an organic light emitting diode according to a first exemplary aspect of the present disclosure.

Figure 3:
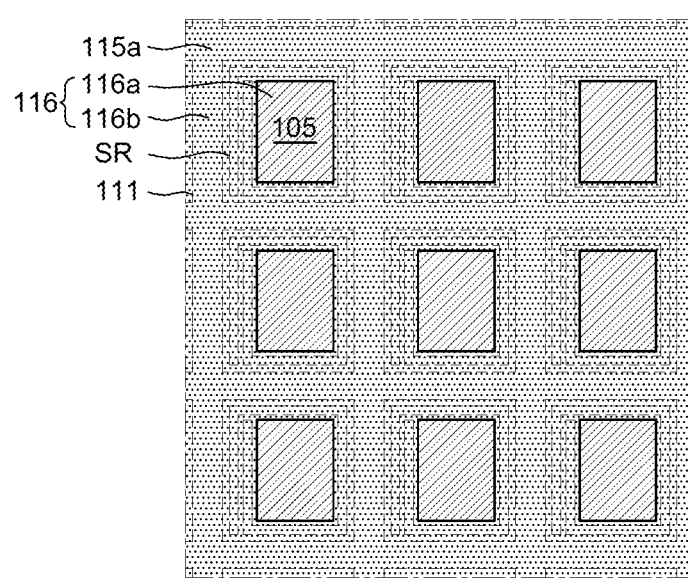
FIG. 3 is an enlarged view illustrating a part of an emission area illustrated in FIG. 2.

FIG. 3 is an enlarged view illustrating a part of an emission area illustrated in FIG. 2.

In the present disclosure, a lighting apparatus using an organic light emitting diode formed of an organic material is provided, rather than a lighting apparatus using an inorganic light emitting diode formed of an inorganic material.

The organic light emitting diode formed of an organic light emitting material has relatively excellent luminous efficiencies of green and red light as compared with an inorganic light emitting diode. Further, widths of emission peaks of red, green, and blue light of the organic light emitting diode are relatively broader than that of the inorganic light emitting diode so that a color rendering index is improved. Therefore, there is an advantage in that light of the light emitting device is more similar to the sunlight.

In the following description, although the lighting apparatus of the present disclosure is described as a flexible lighting apparatus having malleability, the present disclosure may be applied not only to the flexible lighting apparatus, but also to a normal lighting apparatus which is not flexible.

Specifically, referring to FIGS. 1 to 3, a lighting apparatus 100 using an organic light emitting diode according to a first exemplary aspect of the present disclosure includes an organic light emitting diode unit 101 in which surface emission is performed and an encapsulating unit 102 which encapsulates the organic light emitting diode unit 101.

Further, an external light extracting layer 145 which increases a haze may be additionally provided below the organic light emitting diode unit 101, but is not limited thereto and the external light extracting layer may not be provided.

The external light extracting layer 145 is configured such that scattering particles such as TiO2 are dispersed in resin and may be attached below a substrate 110 by means of an adhesive layer 180.

An external barrier layer 146 may be additionally provided between the external light extracting layer 145 and the adhesive layer 180.

The organic light emitting diode unit 101 may be configured by an organic light emitting diode provided on the substrate 110 and an internal light extracting layer 140 may be further provided between the substrate 110 and the organic light emitting diode, but is not limited thereto and the internal light extracting layer may not be provided.

An internal barrier layer 141 may be further provided above the internal light extracting layer 140.

For example, the lighting apparatus 100 according to the first exemplary aspect of the present disclosure may include an emission area which actually emits light to the outside and first and second pad units which are electrically connected to the outside through first and second pad electrodes 127 and 128 at the outer edge of the emission area to apply a signal to the emission area.

The first and second pad units are not blocked by an encapsulating unit of the metal film 170 so as to be electrically connected to the outside through the first and second pad electrodes 127 and 128. Therefore, the metal film 170 may be attached to the front surface of the emission area of the substrate 110 excluding the first and second pad units, but is not limited thereto.

A first insulating layer 115a, an organic layer 130, and a cathode 126 are not formed in the first and second pad units at the outer edge of the emission area so that the first and second pad electrodes 127 and 128 may be exposed to the outside. In this case, a second insulating layer (not illustrated) formed of an organic material and a third insulating layer (not illustrated) formed of an inorganic material may be additionally formed in the emission area so as to cover the organic layer 130 and the cathode 126, but is not limited thereto.

A predetermined area of the first insulating layer 115a above the second pad electrode 128 located in the emission area is removed to form a contact hole 114 which exposes the second pad electrode 128. Therefore, the cathode 126 may be electrically connected to the second pad electrode 128 through the contact hole 114.

The first and second pad units may be disposed at the outside of the emission area and in FIG. 2, the second pad unit is located between the first pad units, but the present disclosure is not limited thereto.

Further, FIG. 2 illustrates that the first and second pad units are located only at one outside of the emission area as an example, but is not limited thereto. Therefore, the first and second pad units of the present disclosure may be disposed at both one outside and the other outside of the emission area. Further, the first pad unit of the present disclosure may be disposed at one outside of the emission area and the second pad unit may be disposed at the other outside of the emission area.

Next, the organic light emitting diode unit 101 will be described in more detail. The anode 116 and the cathode 126 are disposed above the substrate 110 and an organic layer 130 is disposed between the anode 116 and the cathode 126 to configure an organic light emitting diode OLED.

In addition, the organic light emitting diode unit 101 may further include an auxiliary line 111 to compensate the conductivity of the anode 116 and a first insulating layer 115a which suppresses a short between the anode 116 and the cathode 126.

The substrate 110 may be configured by a transparent glass, but is not limited thereto. In the case of a flexible lighting apparatus 100, the substrate 110 may be formed of a polymer material having a flexible property such as polyimide (PI).

The anode 116 may supply holes to the organic layer 130 and the cathode 126 may supply electrons to the organic layer 130, but are not limited thereto and the functions of the anode 116 and the cathode 126 may be switched.

The anode 116 may be formed of a material having a high work function which is transparent metal oxide having a good conductivity, such as indium tin oxide (ITO) or indium zinc oxide (IZO), so as to easily inject holes to the organic layer 130.

In this case, the anode 116 may be divided into a first anode 116a in an emission zone 105 and a second anode 116b in a non-emission zone other than the emission zone 105.

The second anode 116b may be formed on the auxiliary line 111 so as to cover the auxiliary line 111 and the first anode 116a may be formed in the emission zone 105 which is partitioned by a mesh type auxiliary line 111.

The cathode 126 may be formed of a conductive material having a low work function so as to easily inject electrons to the organic layer 130. A metal such as magnesium (Mg), calcium (Ca), sodium (Na), titanium (Ti), indium (In), yttrium (Y), lithium (Li), aluminum (Al), silver (Ag), tin (Sn), and lead (Pb), or an alloy thereof may be used for the cathode 126.

Further, the organic layer 130 may be configured by a single stack structure including a red organic light emitting layer or configured by a multi-stack tandem structure including a plurality of red organic light emitting layers, or a multi-stack tandem structure including a red-green organic light emitting layer and a sky blue organic light emitting layer. However, the present disclosure is not limited thereto and various structures may be applied.

The organic layer 130 may further include an electron injection layer and a hole injection layer which inject electrons and holes to the organic light emitting layer, respectively, an electron transporting layer and a hole transporting layer which transport the injected electrons and holes to the organic light emitting layer, respectively, and a charge generating layer which generates charges such as electrons and holes.

As described above, when a current is applied to the anode 116 and the cathode 126 of the organic light emitting diode, electrons are injected from the cathode 126 to the organic layer 130 and holes are injected from the anode 116 to the organic layer 130. Thereafter, excitons are generated in the organic layer 130. As the generated excitons are decayed, light corresponding to an energy difference of a lowest unoccupied molecular orbital (LUMO) and a highest occupied molecular orbital (HOMO) of the organic light emitting layer is generated.

It is determined whether to perform top emission or bottom emission of the light generated in the organic layer 130 in accordance with a transmittance and a reflectance of the anode 116 and the cathode 126.

For example, when the anode 116 is a transparent electrode and the cathode 126 is a reflective electrode, the light generated in the organic layer 130 is reflected by the cathode 126 to pass through the anode so that the light is generated below the organic light emitting diode unit 101. That is, as illustrated in FIG. 1, the organic light emitting diode unit 101 may perform bottom emission, but is not limited thereto. When the anode 116 is configured as a reflective electrode and the cathode 126 is configured as a transparent electrode, the organic light emitting diode unit 101 may perform top emission.

The internal barrier layer 141 may be disposed below the anode 116 and block moisture and air permeating from the substrate 110 and the internal light extracting layer 140. In order to perform the above-mentioned function, the internal barrier layer 141 may be formed of a single layer of an inorganic material such as silicon oxide SiOx or silicon nitride SiNx. If necessary, the internal barrier layer 141 may be formed by a composite layer of an inorganic material and an organic material.

For example, the internal light extracting layer 140 is disposed between the substrate 110 and the internal barrier layer 141 to increase an efficiency of extracting the light generated from the organic light emitting diode to the outside.

The internal light extracting layer 140 inserts titanium dioxide (TiO2) particles into the resin, to increase internal light scattering and increase surface roughness, thereby increasing a light extracting efficiency. For example, the internal light extracting layer 140 may be formed to have a thickness of 450 nm by an inkjet-coating method and a diameter of titanium dioxide $TiO_2$ particle may be 200 nm to 300 nm. However, the specific value may vary to various values depending on the necessity of the design of the lighting apparatus 100.

Next, the encapsulating unit 102 covers the organic light emitting diode unit 101 to block influence from the outside to protect the organic light emitting diode unit 101 and includes a protective layer 150 which covers the organic light emitting diode unit 101 and a metal film 170 attached thereto through the adhesive layer 160.

In this case, the adhesive layer 160 may be configured by a pressure sensitive adhesive (PSA) or a face seal adhesive (FSA) which attaches the metal film 170 to the organic light emitting diode unit 101. A thickness of the adhesive layer 160 may be approximately 30 μm, but is not limited thereto and the thickness may vary depending on the necessity of the design of the lighting apparatus 100.

The metal film 170 is disposed on the adhesive layer 160 to maintain the rigidity of the lighting apparatus 100. To this end, the metal film 170 may be formed of copper (Cu) having a thickness of approximately 20 μm, but is not limited thereto and may vary in various forms depending on the necessity of the design of the lighting apparatus 100.

In the meantime, in the lighting apparatus using an organic light emitting diode, when the anode and the cathode are shorted due to the foreign matters, the current drops of the entire panel may result in the deterioration of the luminance not only of the corresponding pixel, but also of the entire panel.

Therefore, in the case of the lighting apparatus 100 according to the first exemplary aspect of the present disclosure, a short reduction pattern SR is formed in the anode 116 in which a current is supplied to a unit pixel to avoid short-circuit and the short reduction pattern SR is covered with the first insulating layer 115a to suppress the short of the entire panel. That is, the short reduction pattern SR is formed to enclose an outer edge of the emission zone 105 of the unit pixel and adds resistance to the unit pixels to restrict current flowing in an area where the short is generated.

In this case, the short reduction pattern SR may have an open curve which encloses the outer edge of the emission zone 105, but is not limited thereto and the short reduction pattern SR may include a combination of straight lines or a curve.

Further, the short reduction pattern SR passes through the anode 116 up and down and the inside thereof may be filled with the first insulating layer 115a.

For example, in FIG. 3, it is illustrated the short reduction pattern SR is provided on one side surface of the auxiliary line 111 as one straight line and the short reduction pattern SR is disposed on the other side surface as two straight lines, but is not limited thereto.

In the meantime, in the lighting apparatus 100 according to the first exemplary aspect of the present disclosure, the cathode 126 forms a primary cathode and a secondary cathode. Therefore, the organic layer 130 is patterned only in the emission zone 105 using the primary cathode as a mask and the secondary cathode is formed in the non-emission zone to be electrically connected to the primary cathode. Therefore, the intercellular moisture permeation and dark spot transition due to the defective cathode are blocked, which will be described in more detail with reference to the drawings.

Figure 4:
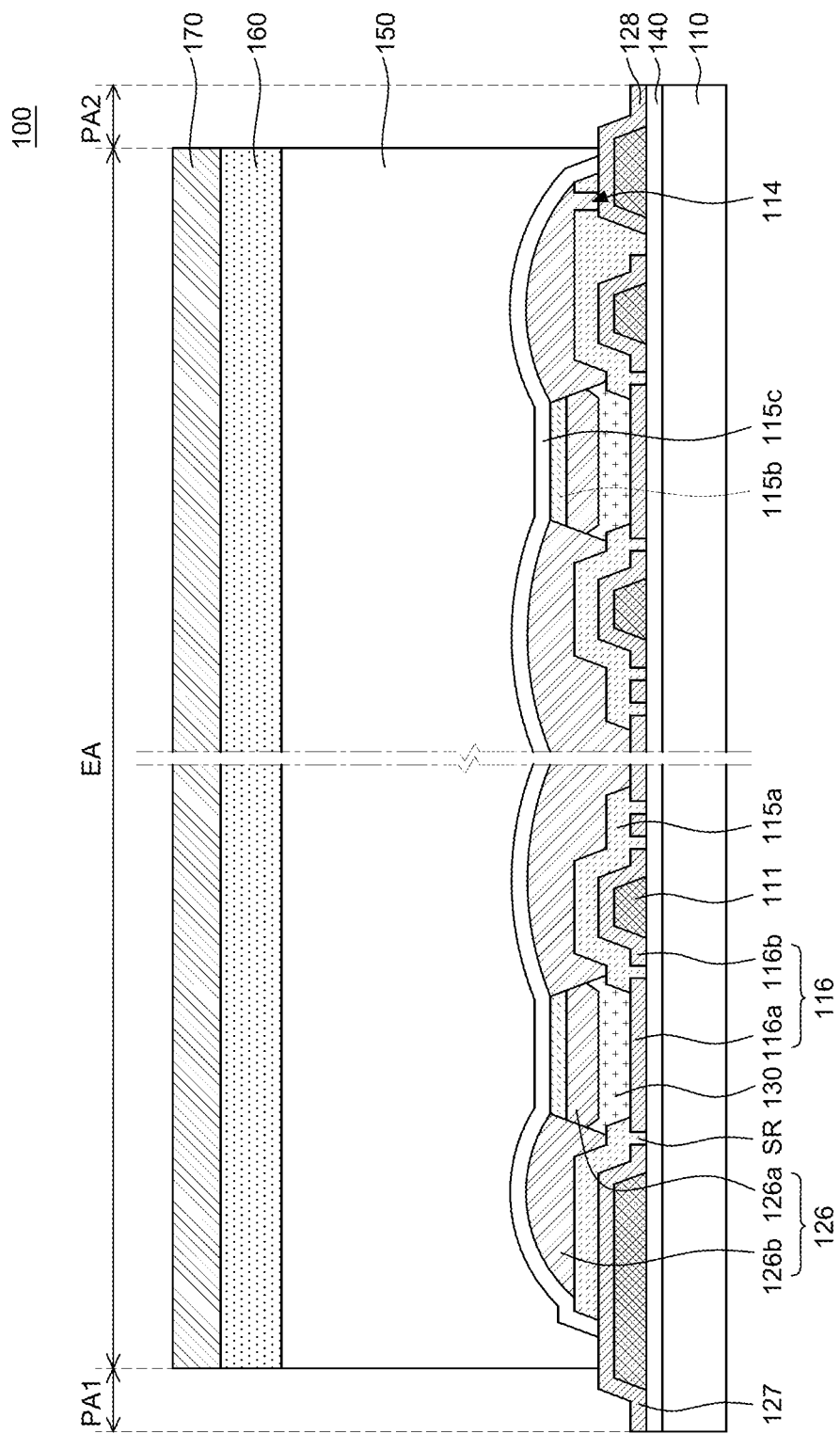
FIG. 4 is a schematic cross-sectional view of a lighting apparatus using an organic light emitting diode according to a first exemplary aspect of the present disclosure taken along line I-I' of FIG. 2.

FIG. 4 is a schematic cross-sectional view of a lighting apparatus using an organic light emitting diode according to a first exemplary aspect of the present disclosure taken along line I-I' of FIG. 2.

Figure 5:
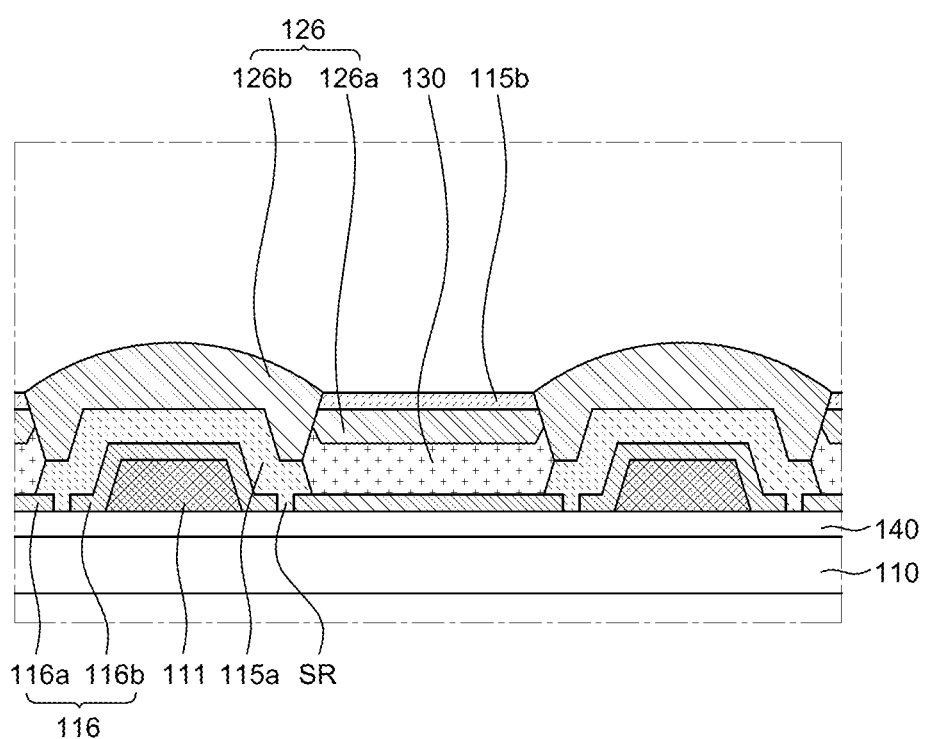
FIG. 5 is an enlarged cross-sectional view illustrating a part of an emission area in a lighting apparatus using an organic light emitting diode according to a first exemplary aspect of the present disclosure illustrated in FIG. 4.

FIG. 5 is an enlarged cross-sectional view illustrating a part of an emission area in a lighting apparatus using an organic light emitting diode according to a first exemplary aspect of the present disclosure illustrated in FIG. 4.

Figure 6:
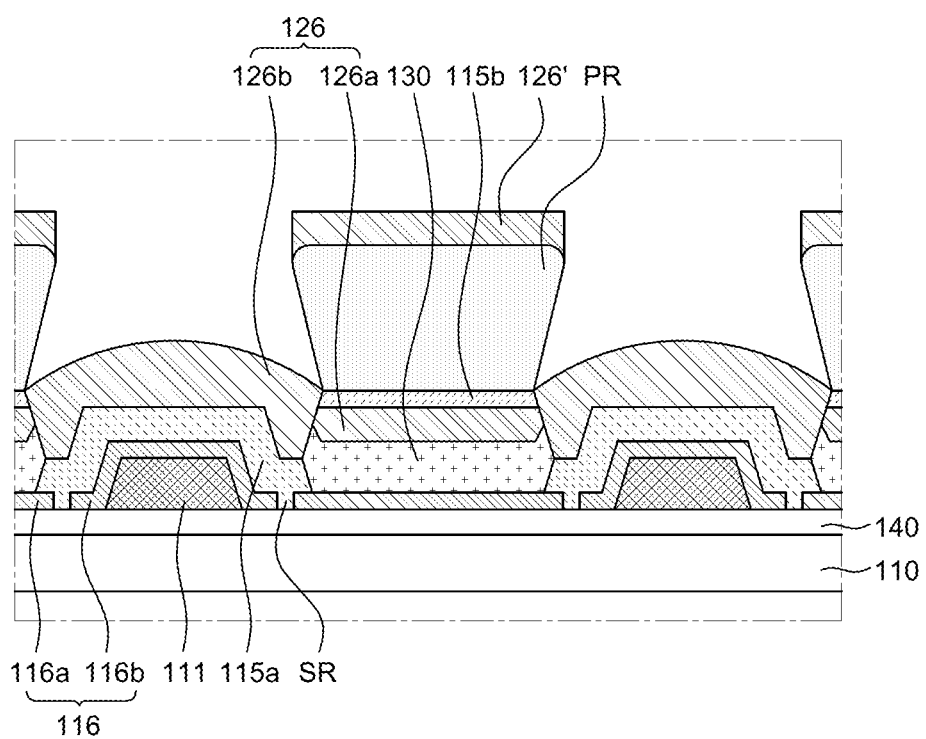
FIG. 6 is a cross-sectional view exemplarily illustrating a part of a manufacturing process in a lighting apparatus using an organic light emitting diode according to a first exemplary aspect of the present disclosure.

FIG. 6 is a cross-sectional view exemplarily illustrating a part of a manufacturing process in a lighting apparatus using an organic light emitting diode according to a first exemplary aspect of the present disclosure.

The present disclosure provides a lighting apparatus using an organic light emitting diode which is formed of an organic material. The lighting apparatus using an organic light emitting diode may not include a driving TFT in the unit pixel.

As described above, although the lighting apparatus of the present disclosure is described as a flexible lighting apparatus having malleability, the present disclosure may be applied not only to the flexible lighting apparatus, but also to a normal lighting apparatus which is not flexible.

The lighting apparatus 100 using an organic light emitting diode according to the first exemplary aspect of the present disclosure may include an organic light emitting diode unit in which surface emission is performed and an encapsulating unit which encapsulates the organic light emitting diode unit.

Referring to FIGS. 4 and 5, the organic light emitting diode unit may be configured by an organic light emitting diode provided on the substrate 110 and an internal light extracting layer 140 may be further provided between the substrate 110 and the organic light emitting diode, but is not limited thereto and the internal light extracting layer may not be provided.

An internal barrier layer (not illustrated) may be further provided above the internal light extracting layer 140.

In this case, the lighting apparatus 100 according to the first exemplary aspect of the present disclosure may include an emission area EA which actually emits light to the outside and first and second pad units PA1 and PA2 which are connected to the outside of the emission area EA through first and second pad electrodes 127 and 128 at the outer edge of the emission area EA to apply a signal to the emission area EA.

Further, the first and second pad units PA1 and PA2 are not blocked by an encapsulating unit of the metal film 170 so as to be electrically connected to the outside through the first and second pad electrodes 127 and 128. Therefore, the metal film 170 may be attached to the front surface of the emission area EA of the substrate 110 excluding the first and second pad units PA1 and PA2, but is not limited thereto.

That is, an organic layer 130 and a cathode 126 are not formed in the first and second pad units PA1 and PA2 at the outer edge of the emission area EA so that the first and second pad electrodes 127 and 128 may be exposed to the outside. In this case, a second insulating layer 115c formed of an organic material and a third insulating layer (not illustrated) formed of an inorganic material may be additionally formed in the emission area EA so as to cover the organic layer 130 and the cathode 126, but is not limited thereto.

A predetermined area of the first insulating layer 115a above the second pad electrode 128 located in the emission area EA is removed to form a contact hole 114 which exposes the second pad electrode 128. Therefore, the cathode 126 may be electrically connected to the second pad electrode 128 through the contact hole 114.

The first and second pad units PA1 and PA2 may be disposed at the outside of the emission area EA, but are not limited thereto.

Further, the first and second pad units PA1 and PA2 may be disposed at one outside of the emission area EA, but are not limited thereto. Therefore, the first and second pad units PA1 and PA2 of the present disclosure may be disposed in both one outside and the other outside of the emission area EA. Further, the first pad unit PA1 of the present disclosure may be located at one outside of the emission area EA and the second pad unit PA2 may be located at the other outside of the emission area EA.

Next, the organic light emitting diode unit will be described in detail. The anode 116 and the cathode 126 are disposed above the substrate 110 and the organic layer 130 is disposed between the anode 116 and the cathode 126 of the emission zone to configure the organic light emitting diode.

In addition, the organic light emitting diode unit may further include an auxiliary line 111 to compensate the conductivity of the anode 116 and a first insulating layer 115a which suppresses a short between the anode 116 and the cathode 126.

The substrate 110 may be formed of a transparent glass. Further, the substrate 110 may be formed of a polymer material having flexibility, such as polyimide (PI).

A predetermined internal light extracting layer 140 may be provided on the substrate 110. However, the present disclosure is not limited thereto.

The anode 116 according to the first exemplary aspect of the present disclosure may be provided on the substrate 110.

The anode 116 may be formed of a material having a high work function which is transparent metal oxide having a good conductivity, such as indium tin oxide (ITO) or indium zinc oxide (IZO), so as to easily inject holes to the organic layer 130.

In this case, the anode 116 may be divided into a first anode 116a in an emission zone and a second anode 116b in a non-emission zone.

The second anode 116b may be formed above the auxiliary line 111 so as to cover the auxiliary line 111 and the first anode 116a may be formed in an emission zone which is partitioned by a mesh type auxiliary line 111.

Therefore, in the case of the lighting apparatus 100 according to the first exemplary aspect of the present disclosure, a short reduction pattern SP is formed in the first anode 116a in which a current is supplied to a unit pixel to avoid short-circuit and the short reduction pattern SR is covered with the first insulating layer 115a to suppress the short of the entire panel. That is, the short reduction pattern SR is formed to enclose an outer edge of the emission zone of the unit pixel and adds resistance to the unit pixels to restrict current flowing in an area where the short is generated.

In this case, the short reduction pattern SR is configured by removing a predetermined area of the first anode 116a and the first insulating layer 115a may be disposed on the anode 116 together with the short reduction pattern SR.

The short reduction pattern SR may have an open curve shape which encloses an outer periphery of the emission zone. Further, the short reduction pattern SR may be a combination of straight lines or include a curve.

The short reduction pattern SR passes through the first anode 116a up and down and the inside thereof may be filled with the first insulating layer 115a.

In the meantime, the first pad electrode 127 which is formed of the same conductive material is disposed in the first pad unit PA1 of the substrate 110 on the same layer as the anode 116 and the second pad electrode 128 is disposed in the second pad unit PA2.

The anode 116 is advantageous in that the anode is formed of a transparent metal oxide material such as ITO to transmit emitted light, but is disadvantageous in that the electric resistance is higher than that of an opaque metal material. Therefore, when a large size lighting apparatus 100 is manufactured, distribution of the current applied to the emission zone is not uniform, so that the light with a uniform luminance may not be emitted from the large size lighting apparatus 100.

Therefore, according to the present disclosure, an auxiliary line formed of an opaque metal material having a low resistance is additionally added on the substrate 110 and the anode 116 includes the auxiliary line 111 to be disposed on the substrate 110.

In this case, the auxiliary line 111 is disposed over the entire emission area EA to have a net type with a small width, a mesh type, a hexagonal or an octagonal, or a circular shape to allow a uniform current to be applied to the first anode 116a of the emission zone on the entire emission area EA. Therefore, the light with a uniform luminance may be emitted from the large size lighting apparatus 100.

The auxiliary line 111 may be formed of an opaque metal having a good conductivity, such as Al, Au, Cu, Ti, W, Mo, or an alloy thereof. Even though not illustrated, the auxiliary line 111 may be configured by a double-layered structure including an upper portion and a lower portion, but is not limited thereto, and may be configured by a single layer.

The first insulating layer 115a may be laminated on the emission area EA of the substrate 110.

For example, the first insulating layer 115a may have a rectangular frame shape entirely having a predetermined width. However, actually, in the emission zone, the first insulating layer 115 is removed to be formed in a mesh type so as to cover auxiliary line 111 disposed in the mesh type, but is not limited thereto.

The first insulating layer 115a may be configured to cover the auxiliary line 111 and the short reduction pattern SR adjacent thereto. Further, the first insulating layer 115a is formed so as to enclose the auxiliary line 111 to relieve the step due to the auxiliary line 111. Therefore, various layers which are formed thereafter may be stably formed without being shorted.

The first insulating layer 115a may be configured by an inorganic material such as SiOx or SiNx.

However, the first insulating layer 115a may be configured by an organic material such as photoacryl and also configured by a plurality of layers of inorganic materials and organic materials.

Further, the organic layer 130 and the cathode 126 may be disposed above the substrate 110 on which the first insulating layer 115a is disposed. A predetermined area of the first insulating layer 115a above the second pad electrode 128 located in the emission area EA is removed to form a contact hole 114 which exposes the second pad electrode 128. Therefore, the cathode 126 may be electrically connected to the second pad electrode 128 therebelow through the contact hole 114.

The cathode 126 may be formed of a conductive material having a low work function so as to easily inject electrons to the organic layer 130. A metal such as magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof may be used for the cathode 126.

The organic layer 130 may be configured by a single stack structure including a red organic light emitting layer EML or formed to have a multi-stack tandem structure including a plurality of red organic light emitting layers, or a multi-stack tandem structure including a red-green organic light emitting layer EML and a sky blue organic light emitting layer EML. However, the present disclosure is not limited thereto and various structures may be applied.

Figure 7A:
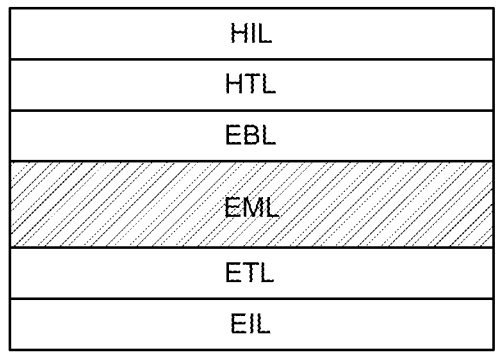
FIGS. 7A to 7C are cross-sectional views illustrating a stack structure of an organic layer according to the present disclosure as an example.
Figure 7B:
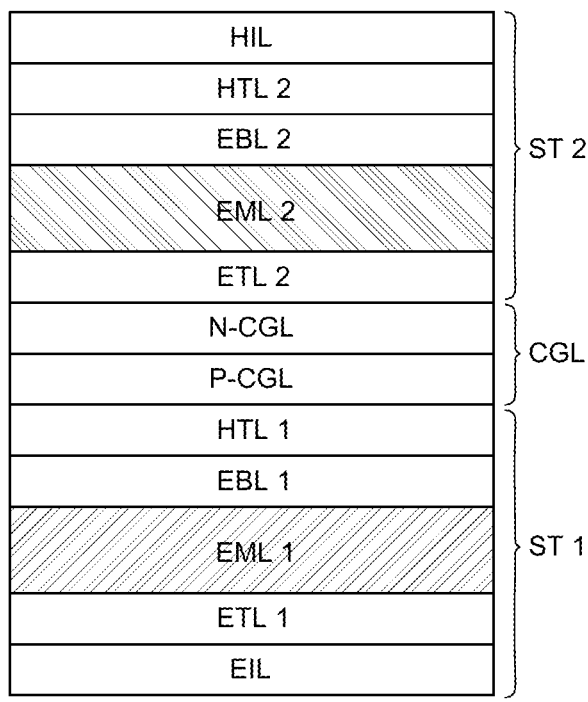
Figure 7C:
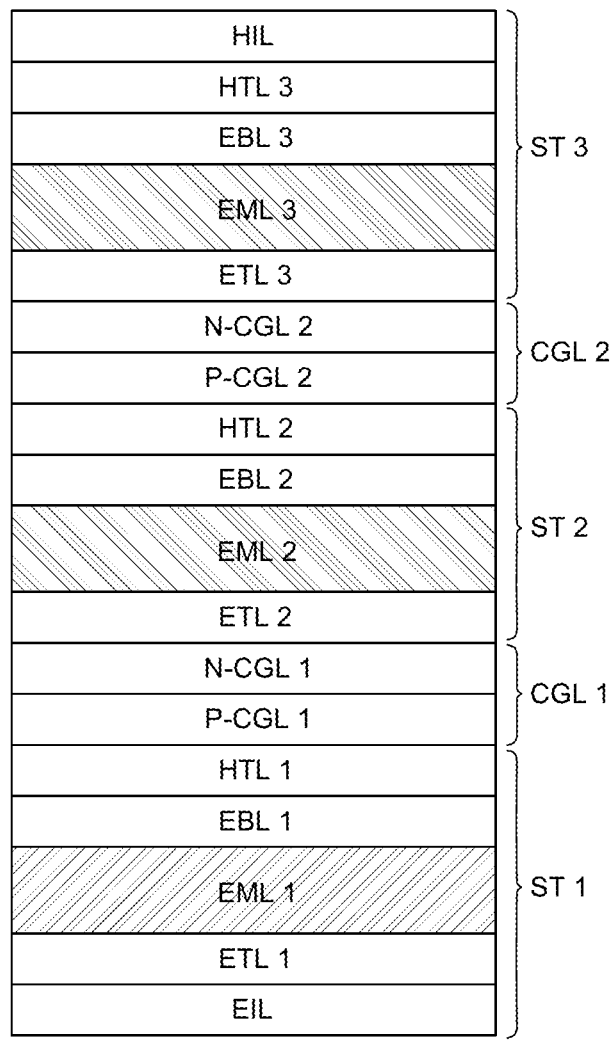

FIGS. 7A to 7C are cross-sectional views illustrating a stack structure of an organic layer according to the present disclosure as an example.

In this case, FIG. 7A illustrates an organic layer 130 having a single stack, FIG. 7B illustrates an organic layer 130 having a tandem structure including a double stack, and FIG. 7C illustrates an organic layer 130 having a tandem structure including a triple stack.

Referring to FIG. 7A, the organic layer 130 is configured by a hole injection layer (HIL), a hole transporting layer (HTL), an electron blocking layer (EBL), an organic light emitting layer (EML), an electron transporting layer (ETL), and an electron injection layer (EIL) which are sequentially laminated.

The hole injection layer HIL is an organic layer which smoothly injects the hole from the anode 116 to the organic light emitting layer EML. The hole injection layer HIL may be formed of a material including any one or more of HAT-CN(dipyrazino[2,3-f:2',3'-h]quinoxaline-2,3,6,7,10,11-hexacarbonitrile), CuPc (copperphthalocyanine), F4-TCNQ(2,3,5,6-tetrafluoro-7,7,8,8-tetracyano-quinodimethane), and NPD(N,N'-bis(naphthalene-1-yl)-N,N'-bis(phenyl)-2,2'-dimethylbenzidine), but is not limited thereto.

The hole transporting layer HTL is an organic layer which smoothly transmits the holes from the hole injection layer HIL to the organic light emitting layer EML. For example, the hole transporting layer HTL may be formed of a material including any one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD (2,2',7,7'-tetrakis(N,N-dimethylamino)-9,9-spirofluorene), and MTDATA(4,4',4''-Tris(N-3-methylphenyl-N-phenyl-amino)-triphenylamine), but is not limited thereto.

The electron blocking layer EBL is an organic layer which blocks the electron injected into the organic light emitting layer EML from crossing over the hole transporting layer HTL. The electron blocking layer EBL blocks the movement of the electron to improve the combination of the hole and the electron in the organic light emitting layer EML and improve luminous efficiency of the organic light emitting layer EML. Even though the electron blocking layer EBL may be formed of the same material as the hole transporting layer HTL and the hole transporting layer HTL and the electron blocking layer EBL may be formed as different layers, it is not limited thereto. The hole transporting layer HTL and the electron blocking layer EBL may be combined.

In the organic light emitting layer EML, the holes supplied through the anode 116 and the electrons supplied through the cathode 126 are recoupled to generate excitons. An area where the excitons are generated may be referred to as an emission zone or a recombination zone.

The organic light emitting layer (EML) is disposed between the hole transporting layer HTL and the electron transporting layer ETL and includes a material which emits light having a specific color. In this case, the organic light emitting layer EML may include a material which emits red light.

The organic light emitting layer EML may have a host-dopant system, that is, a system in which a host material having a large weight ratio is doped with an emission dopant material having a small weight ratio.

In this case, the organic light emitting layer EML may include a plurality of host materials or include a single host material. The organic light emitting layer EML including a plurality of host materials or a single host material is doped with a red phosphorescent dopant material. That is, the organic light emitting layer EML is a red light emitting layer and a range of a wavelength of light emitted from the organic light emitting layer EML may be approximately 600 nm to 660 nm.

The red phosphorescent dopant material is a material which is capable of emitting red light. An EL spectrum of light emitted from the organic light emitting layer EML doped with the red phosphorescent dopant material has a peak in a red wavelength area or has a peak in a wavelength region corresponding to red.

The red phosphorescent dopant material may be formed of a material including any one or more of a iridium (Ir) ligand complex including $Ir(ppy)_3$(fac tris(2-phenylpyridine)iridium)(tris(2-phenylpyridine)iridium), PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), $Ir(piq)_3$(tris(1-phenylisoquinoline)iridium), $Ir(piq)_2$(acac)(bis(1-phenylisoquinoline)(acetylacetonate)iridium), PtOEP (octaethylporphyrin platinum) $PBD:Eu(DBM)_3(Phen)$, and perylene, but is not limited thereto.

The electron transporting layer ETL is supplied with electrons from the electron injection layer EIL. The electron transporting layer ETL transmits the supplied electrons to the organic light emitting layer EML.

Further, the electron transporting layer ETL performs the same function as a hole blocking layer HBL. The hole blocking layer may suppress the holes which do not participate in the recombination from being leaked from the organic light emitting layer EML.

For example, the electron transporting layer ETL may be formed of any one or more of Liq8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), BCP(2,9-Dimethyl-4,7-diphenyl-1,10-phenanthroline), and BAlq(bis(2-methyl-8-quinolinolate)-4-(phenylphenolato)aluminum), but is not limited thereto.

The electron injection layer EIL is a layer which smoothly injects the electron from the cathode 126 to the organic light emitting layer EML. For example, the electron injection layer EIL may be formed of a material including any one or more of alkali metals and alkaline earth metal ions, such as LiF, BaF2, and CsF, but is not limited thereto.

The electron injection layer EIL and the electron transporting layer ETL may be omitted depending on a structure or a characteristic of the lighting apparatus 100 using an organic light emitting diode.

Referring to FIG. 7B, the organic layer 130 includes a first stack ST1 including a first organic light emitting layer EML1, a second stack ST2 including a second organic light emitting layer EML2, and a charge generating layer CGL disposed between the first stack ST1 and the second stack ST2.

Here, the first stack ST1 includes an electron injection layer EIL, a first electron transporting layer ETL1, a first organic light emitting layer EML1, a first electron blocking layer EBL1, and a first hole transporting layer HTL1. The second stack ST2 includes a second electron transporting layer ETL2, a second organic light emitting layer EML2, a second electron blocking layer EBL2, a second hole transporting layer HTL2, and a hole injection layer HIL and the function and the configuration of each layer are as described above.

In the meantime, the charge generating layer CGL is disposed between the first stack ST1 and the second stack ST2. The charge generating layer CGL supplies charges to the first stack ST1 and the second stack ST2 to control a charge balance between the first stack ST1 and the second stack ST2.

The charge generating layer CGL includes an N-type charge generating layer N-CGL and a P-type charge generating layer P-CGL. The N-type charge generating layer N-CGL is in contact with the second electron transporting layer ETL2 and the P-type charge generating layer P-CGL is disposed between the N-type charge generating layer N-CGL and the first hole transporting layer HTL1. The charge generating layer CGL may be configured by a plurality of layers including the N-type charge generating layer N-CGL and the P-type charge generating layer P-CGL, but is not limited thereto and may be configured by a single stack.

The N-type charge generating layer N-CGL injects the electrons to the first stack ST1. The N-type charge generating layer N-CGL may include an N-type dopant material and an N-type host material. The N-type dopant material may be a metal of Group 1 and Group 2 on the periodic table, an organic material which may inject the electrons, or a mixture thereof. For example, the N-type dopant material may be any one of an alkali metal and an alkaline earth metal. That is, the N-type charge generating layer N-CGL may be formed of an alkali metal such as lithium (Li), sodium (Na), potassium (K), or cesium (Cs) or an alkali earth metal such as magnesium (Mg), strontium (Sr), barium (Ba), or radium (Ra), but is not limited thereto.

The N-type host material may be formed of a material which is capable of transmitting electrons, for example, may be formed of any one or more of Alq3(tris(8-hydroxyquinolino)aluminum), Liq(8-hydroxyquinolinolato-lithium), PBD(2-(4-biphenylyl)-5-(4-tert-butylphenyl)-1,3,4-oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2,2',2"-(1,3,5-benzenetriyl)-tris(1-phenyl-1-H-benzimidazole), oxadiazole, triazole, phenanthroline, benzoxazole, and benzthiazole, but is not limited thereto.

The P-type charge generating layer P-CGL injects the holes to the second stack ST2. The P-type charge generating layer P-CGL may include a P-type dopant material and a P-type host material. The P-type dopant material may be formed of metal oxide, an organic material such as tetrafluoro-tetracyanoquinodimethane (F4-TCNQ), HAT-CN (Hexaazatriphenylene-hexacarbonitrile), or hexaazatriphenylene, or a metal material such as $V_2O_5$, MoOx, and WO3, but is not limited thereto. The P-type host material may be formed of a material which is capable of transmitting holes, for example, may be formed of a material including any one or more of NPD(N,N-dinaphthyl-N,N'-diphenyl benzidine) (N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), and MTDATA(4,4',4-Tris(N-3-methylphenyl-N-phenyl-amino)-triphenylamine), but is not limited thereto.

Referring to FIG. 7C, the organic layer 130 includes a first stack ST1 including a first organic light emitting layer EML1, a second stack ST2 including a second organic light emitting layer EML2, a third stack ST3 including a third organic light emitting layer EML3, a first charge generating layer CGL1 disposed between the first stack ST1 and the second stack ST2, and a second charge generating layer CGL2 disposed between the second stack ST2 and the third stack ST3.

Here, the first stack ST1 includes an electron injection layer EIL, a first electron transporting layer ETL1, a first organic light emitting layer EML1, a first electron blocking layer EBL1, and a first hole transporting layer HTL1. The second stack ST2 includes a second electron transporting layer ETL2, a second organic light emitting layer EML2, a second electron blocking layer EBL2, and a second hole transporting layer HTL2. The third stack ST3 includes a third electron transporting layer ETL3, a third organic light emitting layer EML3, a third electron blocking layer EBL3, a third hole transporting layer HTL3, and a hole injection layer HIL. The function and the configuration of each layer are as described above.

Further, the first charge generating layer CGL1 includes a first N-type charge generating layer N-CGL1 and a first P-type charge generating layer P-CGL1 and the first N-type charge generating layer N-CGL1 is in contact with the second electron transporting layer ETL2. The first P-type charge generating layer P-CGL1 is disposed between the first N-type charge generating layer N-CGL1 and the first hole transporting layer HTL1.

The second charge generating layer CGL2 includes a second N-type charge generating layer N-CGL2 and a second P-type charge generating layer P-CGL2 and the second N-type charge generating layer N-CGL2 is in contact with the third electron transporting layer ETL3. The second P-type charge generating layer P-CGL2 is disposed between the second N-type charge generating layer N-CGL2 and the second hole transporting layer HTL2. The functions and configurations of the first and second charge generating layers CGL1 and CGL2 are as described above.

However, the first organic light emitting layer EML1 and the third organic light emitting layer EML3 are red-green organic light emitting layers and a range of a wavelength of light emitted from the first organic light emitting layer EML1 and the third organic light emitting layer EML3 may be approximately 520 nm to 580 nm. Further, the second organic emission layer EML2 is a sky blue organic light emitting layer and a range of a wavelength of light emitted from the second organic emission layer EML2 may be approximately 450 nm to 480 nm.

Referring to FIGS. 4 and 5 again, the organic layer 130 of the present disclosure is disposed to be limited only in the emission zone of the emission area EA, but is not disposed above the auxiliary line 111. Therefore, the organic light emitting diode is not formed above the auxiliary line 111. That is, the organic light emitting diode in the emission area EA may be formed only in a substantially rectangular shape between auxiliary lines 111 formed of a mesh type. Therefore, the intercellular moisture permeation and dark spot transition due to the organic layer 130 are blocked, to improve the reliability.

Therefore, according to the first exemplary aspect of the present disclosure, the primary cathode 126a is used as a mask to pattern the organic layer 130 only in the emission zone and the secondary cathode 126b is formed in the non-emission zone to be electrically connected to the primary cathode 126a.

That is, the cathode 126 according to the first exemplary aspect of the present disclosure includes a primary cathode 126a disposed on the organic layer 130 of the emission zone and a secondary cathode 126b disposed on the first insulating layer 115a of the non-emission zone. In the meantime, the protective layer 115b may be disposed on the primary cathode 126a between the secondary cathodes 126b, but is not limited thereto.

Side surfaces of the organic layer 130, the primary cathode 126a, and the protective layer 115a disposed on the first anode 116a may be tapered in an upward direction, but are not limited thereto and may be tapered in a reverse direction. The side surface of the secondary cathode 126b may be in contact with the side surfaces of the organic layer 130, the primary cathode 126a, and the protective layer 115b and may be tapered in a reverse direction, but is not limited thereto.

The primary cathode 126a and the secondary cathode 126b may be formed of the same conductive material having a low work function, for example, magnesium (Mg), calcium (Ca), sodium (Na), titanium (Ti), indium (In), yttrium (Y), lithium (Li), aluminum (Al), silver (Ag), tin (Sn), and lead (Pb), or an alloy thereof. Specifically, for example, the primary cathode 126a and the secondary cathode 126b may be formed of a reflective conductive material such as silver (Ag). In this case, the light in the non-emission zone is directed toward the lower substrate 110, so that the optical efficiency may be increased. That is, the primary cathode 126a and the secondary cathode 126b are formed of a reflective material to enclose the organic layer 130 of the emission zone 105 to guide the light emitted from the organic layer 130 toward the lower substrate 110. Therefore, the optical efficiency may be increased.

In the meantime, the organic layer 130, the primary cathode 126a, and the protective layer 115b may be patterned by the same mask process, but are not limited thereto.

First, as described above, the organic light emitting diode of the present disclosure may be configured such that the organic layer 130 and the cathode 126 are formed on the substrate 110 on which the anode 116 is formed.

To this end, referring to FIG. 6 together, the organic layer 130 configured by a plurality of layers may be deposited on the front surface of the substrate 110 on which the anode 116 and the first insulating layer 115a are patterned.

In this case, the organic layer 130 may be configured to have the single stack structure or a tandem structure of a multi stack.

Thereafter, a first conductive material for the primary cathode 126a may be deposited on the front surface of the substrate 110 on which the organic layer 130 is deposited. For example, the first conductive material may be configured by a metal such as magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof.

Thereafter, a protective layer 115b and a photosensitive material may be sequentially deposited on the front surface of the substrate 110 on which the first conductive material is deposited. The photosensitive material may be patterned with a photosensitive film pattern PR through an exposure process and a development process using a mask.

The protective layer 115b may be configured by an inorganic material such as transparent conductive oxide (TCO) or SiOx or SiNx.

The reason why the protective layer 115b is deposited before depositing the photosensitive material is to block the moisture permeation onto the side surface of the organic layer 130 during the process because the photolithographic process using a photosensitive material is a wet process.

Next, the protective layer 115b, the first conductive material, and the organic layer 130 therebelow are etched using the patterned photosensitive film pattern RP as a mask to pattern the organic layer 130, the primary cathode 126a, and the protective layer 115b only in the emission zone. In this case, in order to pattern the organic layer 130, in addition to the photosensitive film pattern PR, the primary cathode 126a which is already patterned may be used as a mask.

Next, a second conductive material 126' may be deposited on the front surface of the substrate 110 on which the organic layer 130, the primary cathode 126a, and the protective layer 115b are limitedly patterned to pattern the secondary cathode. The second conductive material 126' may be the same as the first conductive material, but is not limited thereto. For example, the second conductive material 126' may be configured by a metal such as magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof.

In this case, the second conductive material 126' of the non-emission zone and the second conductive material 126' in the emission zone, that is, on the photosensitive film pattern PR may be separated by the step depending on the thickness of the photosensitive film pattern PR.

Thereafter, the photosensitive film pattern PR and the second conductive material 126' above the photosensitive film pattern PR are removed together so that the secondary cathode 126b may be limitedly patterned above the first insulating layer 115a of the non-emission zone. In this case, the photosensitive film pattern PR and the second conductive material 126' above the photosensitive film pattern PR may be removed by the lift-off method, but is not limited thereto.

The protective layer 115b may be disposed on the primary cathode 126a between the secondary cathodes 126b, but is not limited thereto.

Side surfaces of the organic layer 130, the primary cathode 126a, and the protective layer 115a disposed on the first anode 116a may be tapered in an upward direction, but are not limited thereto and may be tapered in a reverse direction. The side surface of the secondary cathode 126b may be in contact with the side surfaces of the organic layer 130, the primary cathode 126a, and the protective layer 115b and is tapered in a reverse direction, but is not limited thereto.

A second insulating layer 115c and a third insulating layer may be provided on the substrate 110 on which the cathode 126 is formed.

The second insulating layer 115c is formed to cover the organic layer 130 and the cathode 126 of the emission area EA to suppress the moisture from permeating into the organic layer 130 of the emission area EA.

According to the present disclosure, in addition to the encapsulating unit of the adhesive layer 160 and the metal film 170, the second insulating layer 115c and the third insulating layer are formed to cover the organic layer 130 and the cathode 126 of the emission area EA. Therefore, the moisture permeation into the organic layer 130 may be further suppressed.

The second insulating layer 115c may be configured by an inorganic material such as SiOx or SiNx. Further, the third insulating layer may be configured by an organic material such as photoacryl. However, the present disclosure is not limited thereto.

A predetermined protective layer 150 may be provided above the third insulating layer.

As described above, the first pad electrode 127 which is connected to the anode 116 may be exposed to the outside on the substrate 110 of the first pad unit PA1 The second pad electrode 128 which is electrically connected to the cathode 126 may be exposed to the outside through the contact hole 114 on the substrate 110 of the second pad unit PA2. Therefore, the first pad electrode 127 and the second pad electrode 128 are electrically connected to the external power source to apply current to the anode 116 and the cathode 126, respectively.

The adhesive layer 160 such as a pressure sensitive adhesive (PSA) or a face seal adhesive (FSA) is provided on the protective layer 150 and a metal film 170 is disposed thereon, to seal the lighting apparatus 100.

In this case, the encapsulating unit of the adhesive layer 160 and the metal film 170 may be attached to sufficiently cover the second insulating layer 115c and the third insulating layer.

According to the present disclosure, a protective layer may not be used to pattern the organic layer 130 and the primary cathode 126a, which will be described in detail with reference to the drawings.

Figure 8:
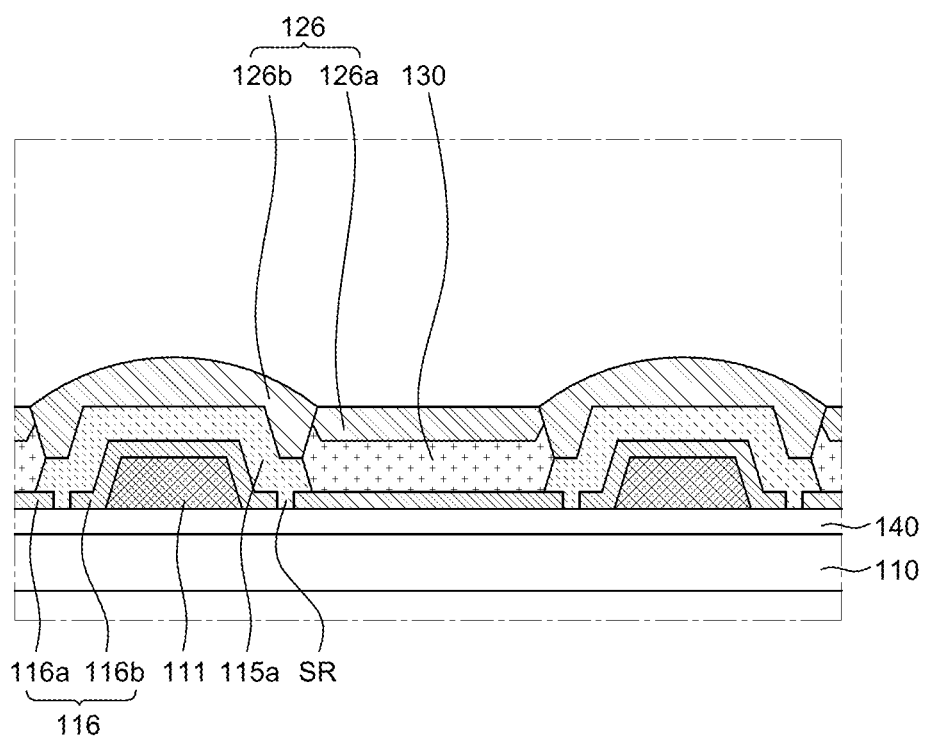
FIG. 8 is a cross-sectional view illustrating another example of a lighting apparatus using an organic light emitting diode according to a first exemplary aspect of the present disclosure.

FIG. 8 is a cross-sectional view illustrating another example of a lighting apparatus using an organic light emitting diode according to a first exemplary aspect of the present disclosure to enlarge a part of an emission area.

Another example of a lighting apparatus using an organic light emitting diode of FIG. 8 is substantially the same as the lighting apparatus of FIG. 5 except that the protective layer is not used to pattern the organic layer 130 and the primary cathode 126a, so that a redundant description will be omitted.

Referring to FIG. 8, the organic layer 130 configured by a plurality of layers may be deposited on the front surface of the substrate 110 on which the anode 116 and the first insulating layer 115a are patterned.

In this case, the organic layer 130 may be configured to have the single stack structure or a tandem structure of a multi stack.

Thereafter, a first conductive material for the primary cathode 126a may be deposited on the front surface of the substrate 110 on which the organic layer 130 is deposited. For example, the first conductive material may be configured by a metal such as magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof.

Next, a photosensitive material may be deposited on the front surface of the substrate 110 on which the first conductive material is deposited. The photosensitive material may be patterned with a predetermined photosensitive film pattern through an exposure process and a development process using a mask.

Next, the first conductive material and the organic layer 130 are etched using the patterned photosensitive pattern as a mask to limitedly pattern the organic layer 130 and the primary cathode 126a only in the emission zone. In this case, in order to pattern the organic layer 130, in addition to the photosensitive film pattern, the primary cathode 126a which is already patterned may be used as a mask.

Next, a second conductive material may be deposited on the front surface of the substrate 110 on which the organic layer 130 and the primary cathode 126a are limitedly patterned to pattern the secondary cathode. The second conductive material may be the same as the first conductive material, but is not limited thereto. For example, the second conductive material may be configured by a metal such as magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof.

In this case, the second conductive material of the non-emission zone and the second conductive material in the emission zone, that is, on the photosensitive film pattern may be separated by a step in accordance with the thickness of the photosensitive film pattern.

Thereafter, the photosensitive film pattern and the second conductive material above the photosensitive film pattern are removed together so that the secondary cathode 126b may be limitedly patterned above the first insulating layer 115a of the non-emission zone. In this case, the photosensitive film pattern and the second conductive material above the photosensitive film pattern may be removed by the lift-off method, but is not limited thereto.

The primary cathode 126a may be disposed on the primary cathode 126a between the secondary cathodes 126b, but is not limited thereto.

Side surfaces of the organic layer 130 and the primary cathode 126a disposed on the first anode 116a of the emission zone may be tapered in an upward direction, but are not limited thereto and may be tapered in a reverse direction. The side surface of the secondary cathode 126b may be in contact with the side surfaces of the organic layer 130 and the primary cathode 126a and is tapered in a reverse direction, but is not limited thereto.

In the meantime, the present disclosure may also be applied to a single-side light emitting transparent lighting apparatus and a both-surface light emitting transparent lighting apparatus, which will be described in more detail by a second exemplary aspect and a third exemplary aspect of the present disclosure.

Figure 9:
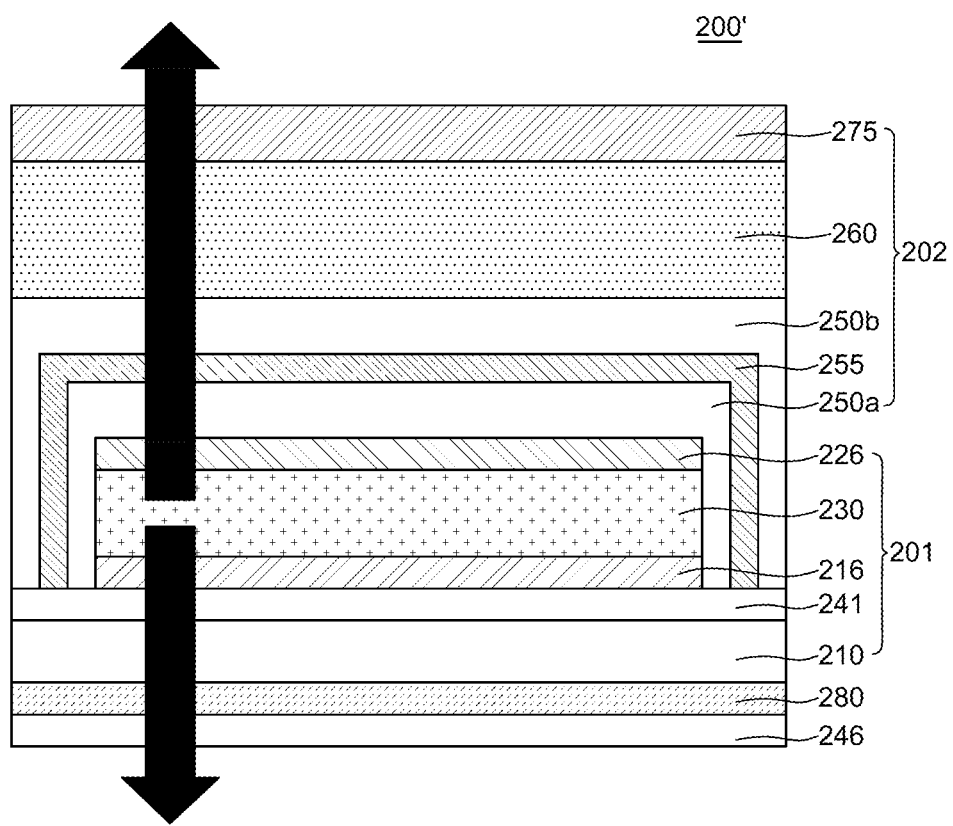
FIG. 9 is a cross-sectional view exemplarily illustrating a lighting apparatus using an organic light emitting diode according to a second exemplary aspect of the present disclosure.

FIG. 9 is a cross-sectional view exemplarily illustrating a lighting apparatus using an organic light emitting diode according to a second exemplary aspect of the present disclosure.

Figure 10:
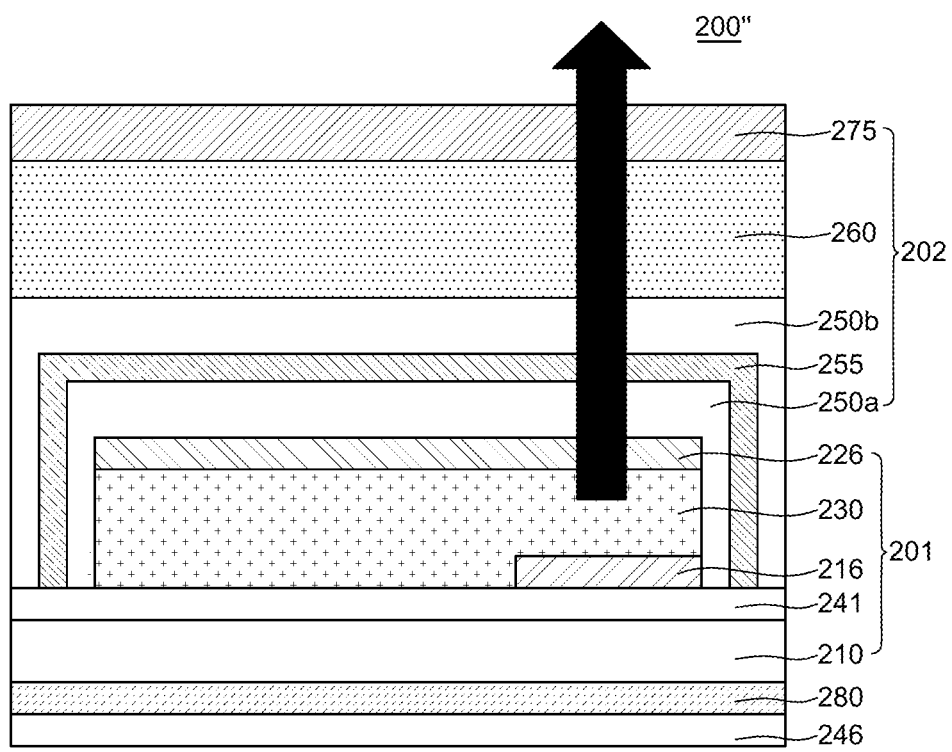
FIG. 10 is a cross-sectional view illustrating another example of a lighting apparatus using an organic light emitting diode according to a second exemplary aspect of the present disclosure.

FIG. 10 is a cross-sectional view illustrating another example of a lighting apparatus using an organic light emitting diode according to a second exemplary aspect of the present disclosure.

FIG. 9 illustrates a double-side light emitting transparent lighting apparatus 200' as an example and FIG. 10 illustrates a single-side light emitting transparent lighting apparatus 200" as an example.

Referring to FIGS. 9 to 10, lighting apparatuses 200' and 200" using an organic light emitting diode according to a second exemplary aspect of the present disclosure include an organic light emitting diode unit 201 in which surface emission is performed and an encapsulating unit 202 which encapsulates the organic light emitting diode unit 201.

Further, an external barrier layer 246 may be provided below the organic light emitting diode unit 201, but is not limited thereto. The external barrier layer 246 may be attached to a lower portion of the substrate 210 through the adhesive layer 280.

The organic light emitting diode unit 201 may be configured by an organic light emitting diode provided on the substrate 210 and an internal barrier layer 241 may be further provided between the substrate 210 and the organic light emitting diode, but is not limited thereto.

An anode 216 and a cathode 226 are disposed above the substrate 210 and an organic layer 230 is disposed between the anode 216 and the cathode 226 to configure the organic light emitting diode.

In this case, the organic light emitting diode unit 201 may further include an auxiliary line (not illustrated) to compensate the conductivity of the anode 216 and a first insulating layer 115a which suppresses a short between the anode 216 and the cathode 226.

The substrate 210 may be configured by a transparent glass, but is not limited thereto. In the case of the flexible lighting apparatuses 200' and 200", the substrate 210 may be formed of a polymer material having flexibility such as polyimide (PI).

The anode 216 may supply holes to the organic layer 230 and the cathode 226 may supply electrons to the organic layer 230, but are not limited thereto and the functions of the anode 216 and the cathode 226 may be switched.

The anode 216 may be formed of a material having a high work function which is transparent metal oxide having a good conductivity, such as indium tin oxide (ITO) or indium zinc oxide (IZO), so as to easily inject holes to the organic layer 230.

The anode 216 may be divided into a first anode of an emission zone and a second anode of a non-emission zone other than the emission zone.

The cathode 226 may be formed of a conductive material having a low work function so as to easily inject electrons to the organic layer 230. An example of a material used for the cathode 226 may include transparent conductive oxide such as indium tin oxide (ITO) or indium zinc oxide (IZO) or a thin film metal having semitransparent such as silver (Ag), magnesium (Mg), or an alloy thereof. As it will be described below, the primary cathode and the secondary cathode may be configured by the same conductive material, but is not limited thereto. Therefore, the secondary cathode may be configured by an opaque conductive material which is different from the primary cathode.

As described above, as the anode 216 and the cathode 226 including at least the primary cathode are configured by a conductive material through which the light may be transmitted, light may be emitted on both surfaces in the emission zone to implement a single-side light emitting transparent lighting apparatus 200" and a double-side light emitting transparent lighting apparatus 200'.

Further, the organic layer 230 may be configured by a single stack structure including a red organic light emitting layer EML or formed to have a multi-stack tandem structure including a plurality of red organic light emitting layers, or a multi-stack tandem structure including a red-green organic light emitting layer EML and a sky blue organic light emitting layer EML. However, the present disclosure is not limited thereto and various structures may be applied.

The organic layer 230 may further include an electron injection layer and a hole injection layer which inject electrons and holes to the organic light emitting layer, respectively, an electron transporting layer and a hole transporting layer which transport the injected electrons and holes to the organic light emitting layer, respectively, and a charge generating layer which generates charges such as electrons and holes.

As described above, the internal barrier layer 241 may be disposed below the anode 216 and block moisture and air permeating from the substrate 210. In order to perform the above-mentioned function, the internal barrier layer 241 may be formed of a single layer of an inorganic material such as silicon oxide SiOx or silicon nitride SiNx. If necessary, the internal barrier layer 241 may be formed by a composite layer of an inorganic material and an organic material.

Next, the encapsulating unit 202 covers the organic light emitting diode unit 201 to block influence from the outside to protect the organic light emitting diode unit 201. The encapsulating unit 202 includes multiple protective layers 250a, 255, and 250b which cover the organic light emitting diode unit 201 and a barrier film 275 attached thereto through the adhesive layer 260.

In this case, the multiple protective layers 250a, 255, 250b may include a first inorganic layer 250a, an organic layer 255, and a second inorganic layer 250b. The first inorganic layer 250a and the second inorganic layer 250b are formed of silicon oxide (SiO2) or silicon nitride (SiNx) which is an inorganic insulating material to block moisture and oxygen from entering. The organic layer 255 is formed of an organic insulating material such as polymer and is interposed between the first inorganic layer 250a and the second inorganic layer 250b. It is illustrated that the multiple protective layers 250a, 255, and 250b of FIG. 9 include the first inorganic layer 250a, the organic layer 255, and the second inorganic layer 250b. However, the present disclosure is not limited thereto and all structures which protect the internal components from moisture and oxygen may be included. That is, the multiple protective layer 250a, 255, and 250b may include at least one inorganic layer to block the permeation of the moisture and oxygen or may have a lamination structure of a plurality of inorganic layers or a lamination structure including one or more inorganic layers and organic layers.

The adhesive layer 260 may be configured by a pressure sensitive adhesive (PSA) or a face seal adhesive (FSA) which attaches the barrier film 275 to the organic light emitting diode unit 201.

The barrier film 275 is disposed on the adhesive layer 260 to absorb an external impact of the lighting apparatuses 200' and 200" and protect the lighting apparatuses 200' and 200". To this end, the barrier film 275 may be formed of a polyethylene terephthalate (PET) film which is a polymer film having a thickness of 100 um, but is not limited thereto and may vary in various forms depending on the necessity of the design of the lighting apparatus 200' and 200".

In the meantime, in the lighting apparatuses 200' and 200" according to the second exemplary aspect of the present disclosure, similarly to the first exemplary aspect of the present disclosure described above, the cathode 226 forms a primary cathode and a secondary cathode. Therefore, the organic layer 230 is patterned only in the emission zone using the primary cathode as a mask and the secondary cathode is formed in the non-emission zone to be electrically connected to the primary cathode. Therefore, the intercellular moisture permeation and dark spot transition due to the defective cathode are blocked.

Figure 11:
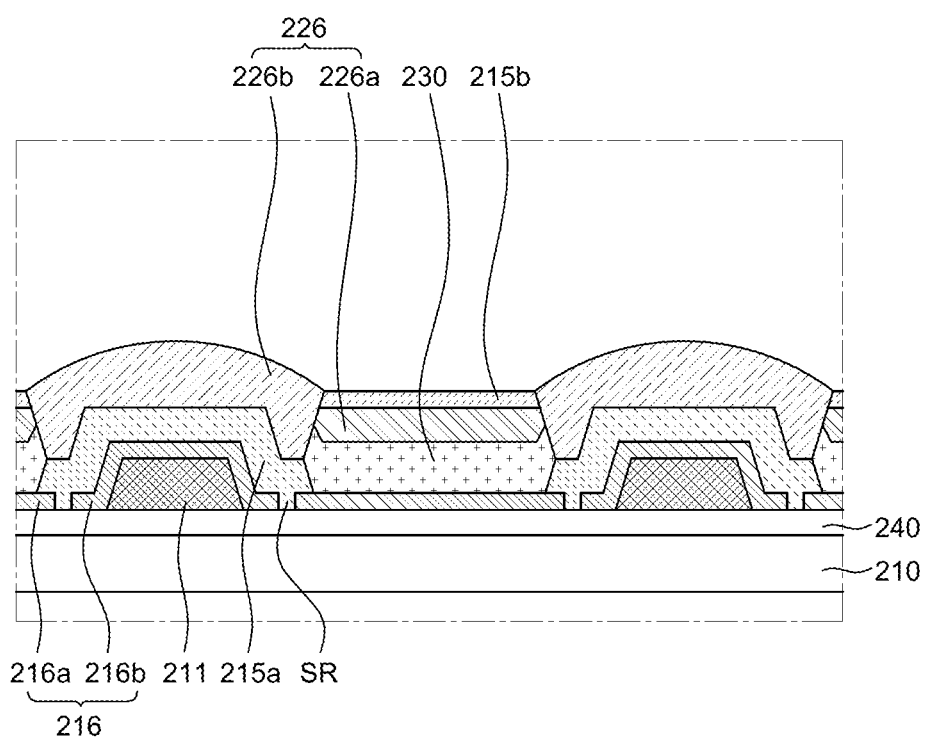
FIG. 11 is an enlarged cross-sectional view illustrating a part of an emission area in a lighting apparatus using an organic light emitting diode according to a second exemplary aspect of the present disclosure

FIG. 11 is an enlarged cross-sectional view illustrating a part of an emission area in a lighting apparatus using an organic light emitting diode according to a second exemplary aspect of the present disclosure.

Referring to FIG. 11, a substrate 210 may be formed of a transparent glass. Further, the substrate 210 may be formed of a polymer material having flexibility, such as polyimide (PI).

A predetermined internal light extracting layer 240 may be provided on the substrate 210. However, the present disclosure is not limited thereto.

An anode 216 according to the second exemplary aspect of the present disclosure may be provided on the substrate 210.

The anode 216 may be formed of a material having a high work function which is transparent metal oxide having a good conductivity, such as indium tin oxide (ITO) or indium zinc oxide (IZO), so as to easily inject holes to the organic layer 230.

In this case, the anode 216 may be divided into a first anode 216a in an emission zone and a second anode 216b in a non-emission zone.

The second anode 216b may be formed on the auxiliary line 211 so as to cover the auxiliary line 211 and the first anode 216a may be formed in an emission zone which is partitioned by a mesh type auxiliary line 211.

In the case of the lighting apparatuses 200' and 200" according to the second exemplary aspect of the present disclosure, a short reduction pattern SR is formed in the first anode 216a in which a current is supplied to a unit pixel to avoid short-circuit and the short reduction pattern SR is covered with the first insulating layer 215a to suppress the short of the entire panel.

In this case, the short reduction pattern SR is configured by removing a predetermined area of the first anode 216a and the first insulating layer 215a may be disposed on the anode 216 together with the short reduction pattern SR.

The short reduction pattern SR may have an open curve shape which encloses an outer periphery of the emission zone. Further, the short reduction pattern SR may be a combination of straight lines or include a curve.

The short reduction pattern SR passes through the first anode 216a up and down and the inside thereof may be filled with the first insulating layer 215a.

Even though not illustrated in the drawing, a first pad electrode formed of the same conductive material is disposed in the first pad unit on the same layer as the anode 216 and a second pad electrode may be disposed in the second pad unit.

The anode 216 is advantageous in that the anode is formed of transparent metal oxide material such as ITO to transmit emitted light, but is disadvantageous in that the electric resistance is higher than that of an opaque metal material. Therefore, in the case of a large size lighting apparatus 200' and 200", distribution of the current applied to the emission zone is not uniform, so that the light with a uniform luminance may not be emitted from the large size lighting apparatus 200' and 200".

Therefore, according to the present disclosure, an auxiliary line formed of an opaque metal material having a low resistance is additionally included on the substrate 210 and the anode 216 includes the auxiliary line 211 to be disposed on the substrate 210.

The auxiliary electrode 211 is disposed over the entire emission area to have a net type with a small width, a mesh type, a hexagonal or an octagonal, or a circular shape to allow a uniform current to be applied to the first anode 216a of the emission zone on the entire emission area EA. Therefore, the light with a uniform luminance may be emitted from the large size lighting apparatus 200' and 200".

The auxiliary line 211 may be formed of an opaque metal having a good conductivity, such as Al, Au, Cu, Ti, W, Mo, or an alloy thereof, but is not limited thereto and may be configured by TCO. Even though not illustrated, the auxiliary line 211 may be configured by a double-layered structure including an upper portion and a lower portion, but is not limited thereto, and may be configured by a single layer.

The first insulating layer 215a may be laminated on the emission area of the substrate 210.

For example, the first insulating layer 215a may have a rectangular frame shape entirely having a predetermined width. However, actually, in the emission zone, the first insulating layer 215a is removed to be formed in a mesh type so as to cover auxiliary line 211 disposed in the mesh type, but is not limited thereto.

The first insulating layer 215a may be configured to cover the auxiliary line 211 and the short reduction pattern SR adjacent thereto. Further, the first insulating layer 215a is formed so as to enclose the auxiliary line 211 to relieve the step due to the auxiliary line 211. Therefore, various layers which are formed thereafter may be stably formed without being shorted.

The first insulating layer 215a may be configured by an inorganic material such as SiOx or SiNx.

However, the first insulating layer 215a may be configured by an organic material such as photoacryl and also configured by a plurality of layers of inorganic materials and organic materials.

Further, the organic layer 230 and the cathode 226 may be disposed above the substrate 210 on which the first insulating layer 215a is disposed. A predetermined area of the first insulating layer 215a above the second pad electrode located in the emission area is removed to form a contact hole which exposes the second pad electrode. Therefore, the cathode 226 may be electrically connected to the second pad electrode therebelow through the contact hole.

The cathode 226 may be formed of a conductive material having a low work function so as to easily inject electrons to the organic layer 230.

The organic layer 230 may be configured by a single stack structure including a red organic light emitting layer EML or formed to have a multi-stack tandem structure including a plurality of red organic light emitting layers, or a multi-stack tandem structure including a red-green organic light emitting layer EML and a sky blue organic light emitting layer EML. However, the present disclosure is not limited thereto and various structures may be applied.

The organic layer 230 of the present disclosure is limitedly disposed only in the emission zone of the emission area, but is not disposed above the auxiliary line 211 so that the organic light emitting diode is not formed above the auxiliary line 211. That is, the organic light emitting diode in the emission area may be formed only in a substantially rectangular shape between auxiliary lines 211 formed of a mesh type. Therefore, the intercellular moisture permeation and dark spot transition due to the organic layer 230 are blocked, to improve the reliability.

In the meantime, the cathode 226 according to the second exemplary aspect of the present disclosure includes a primary cathode 226a disposed on the organic layer 230 of the emission zone and a secondary cathode 226b disposed on the first insulating layer 215a of the non-emission zone. In the meantime, the protective layer 215b may be disposed on the primary cathode 226a between the secondary cathodes 226b, but is not limited thereto.

Side surfaces of the organic layer 230, the primary cathode 226a, and the protective layer 215b disposed on the first anode 216a may be tapered in an upward direction, but are not limited thereto and may be tapered in a reverse direction. The side surface of the secondary cathode 226b may be in contact with the side surfaces of the organic layer 230, the primary cathode 226a, and the protective layer 215b and is tapered in a reverse direction, but is not limited thereto.

An example of a material used for the primary cathode 226a may include transparent conductive oxide such as indium tin oxide (ITO) or indium zinc oxide (IZO) or a thin film metal having a semitransparent such as silver (Ag), magnesium (Mg), or an alloy thereof. The secondary cathode 226b may be configured by the same conductive material as the primary cathode 226a, but is not limited thereto. The secondary cathode 226b according to the second exemplary aspect of the present disclosure illustrated in FIG. 11 may be configured by an opaque conductive material which is different from that of the primary cathode 226a. Specifically, the secondary cathode 226b may be formed of a reflective conductive material such as silver (Ag). In this case, the light in the non-emission zone is directed toward the lower substrate 210, so that the optical efficiency may be increased.

The exemplary aspects of the present disclosure can also be described as follows:

According to an aspect of the present disclosure, there is provided a lighting apparatus using an organic light emitting diode. The lighting apparatus using an organic light emitting diode may include an anode disposed in an emission area of a substrate; an insulating layer disposed on the anode of a non-emission zone of the emission area; an organic layer and a primary cathode disposed on an anode of an emission zone of the emission area; a secondary cathode which is disposed on the insulating layer and is laterally connected to the primary cathode; and an encapsulating unit disposed above the substrate, wherein the organic layer may be limitedly disposed in the emission zone by the primary cathode and the secondary cathode.

The lighting apparatus using an organic light emitting diode may further include an auxiliary line disposed on the substrate, wherein the anode may include the auxiliary line to be disposed on the emission area of the substrate.

The lighting apparatus using an organic light emitting diode may further include a short reduction pattern which is configured by removing a predetermined area of the anode and encloses the emission zone, wherein the insulating layer may include the short reduction pattern to be disposed on the anode.

The insulating layer may be disposed on the auxiliary line to cover the auxiliary line.

The lighting apparatus using an organic light emitting diode may further include first and second pad electrodes disposed on one outside of the emission area, wherein the first pad electrode may be connected to the anode and the second pad electrode is connected to the secondary cathode.

The lighting apparatus using an organic light emitting diode may further include a protective layer disposed on the primary cathode between the secondary cathodes.

The protective layer may be configured by transparent conductive oxide (TCO) or an inorganic material.

Side surfaces of the organic layer disposed on the anode of the emission zone, the primary cathode, and the protective layer may be tapered in an upward direction.

A side surface of the secondary cathode may be in contact with the side surfaces of the organic layer, the primary cathode, and the protective layer and is tapered in a reverse direction.

The primary cathode and the secondary cathode may be configured by at least one metal of magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof.

The primary cathode and the secondary cathode may be configured by transparent conductive oxide (TCO), a thin film metal material having a semitransparent.

The primary cathode may be configured by transparent conductive oxide (TCO), a thin film metal material having a semitransparent and the secondary cathode may be configured by silver (Ag).

The encapsulating unit may include: multiple protective layers which cover the substrate including the primary cathode and the secondary cathode; and a metal film or a barrier film attached to the multiple protective layers by means of an adhesive layer.

The multiple protective layers may include a first inorganic layer, an organic layer on the first inorganic layer, and a second inorganic layer on the organic layer.

According to another aspect of the present disclosure, there is provided a lighting apparatus using an organic light emitting diode. The lighting apparatus using an organic light emitting diode may include a first anode disposed in an emission zone of a substrate; a second anode disposed in a non-emission zone of the substrate; an insulating layer on the second anode to cover the entire second anode and a part of the first anode; an organic layer and a primary cathode which are sequentially disposed on the first anode; a secondary cathode which is disposed on the insulating layer and is laterally connected to the primary cathode; and an encapsulating unit disposed above the substrate, wherein the organic layer may be limitedly disposed in the emission zone by the primary cathode and the secondary cathode to block intercellular moisture permeation and dark spot transition due to the organic layer.

The lighting apparatus using an organic light emitting diode may further include a protective layer disposed on the primary cathode between the secondary cathodes.

The protective layer may be configured by transparent conductive oxide (TCO) or an inorganic material.

Side surfaces of the organic layer disposed on the first anode, the primary cathode, and the protective layer may be tapered in an upward direction.

A side surface of the secondary cathode may be in contact with the side surfaces of the organic layer, the primary cathode, and the protective layer and is tapered in a reverse direction.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus using an organic light emitting diode, comprising:
   a first anode and a second anode respectively disposed in an emission zone and a non-emission zone of an emission area defined at a substrate;
   a first insulating layer disposed on the second anode;
   an organic layer and a primary cathode disposed on the first anode;
   a secondary cathode disposed on the insulating layer and laterally connected to the primary cathode; and
   an encapsulating material disposed above the substrate,
   wherein the organic layer is disposed only between the primary cathode and the secondary cathode in the emission zone.

2. The lighting apparatus according to claim 1, further comprising an auxiliary line disposed on the substrate,
   wherein the second anode is disposed on the auxiliary line in the emission area.

3. The lighting apparatus according to claim 1, further comprising a short reduction pattern formed between the first anode and the second anode in the emission zone,
   wherein the first insulating layer is disposed on the anode and fills the short reduction pattern.

4. The lighting apparatus according to claim 3, wherein the first insulating layer is disposed on the auxiliary line.

5. The lighting apparatus according to claim 1, further comprising first and second pad electrodes disposed outside the emission area,
   wherein the first pad electrode is connected to the second anode and the second pad electrode is connected to the secondary cathode.

6. The lighting apparatus according to claim 1, further comprising a protective layer disposed on the primary cathode located between the secondary cathodes.

7. The lighting apparatus using an organic light emitting diode according to claim 6, wherein the protective layer includes a transparent conductive oxide or an inorganic material.

8. The lighting apparatus according to claim 6, wherein the organic layer contacts the first anode of the emission zone, the primary cathode, and the protective layer and has tapered side surfaces in an upward direction.

9. The lighting apparatus using an organic light emitting diode according to claim 8, wherein the secondary cathode contacts the side surfaces of the organic layer, the primary cathode, and the protective layer and has a tapered side surface in a reverse direction.

10. The lighting apparatus using an organic light emitting diode according to claim 1, wherein the primary cathode and the secondary cathode include at least one of magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof.

11. The lighting apparatus using an organic light emitting diode according to claim 1, wherein the primary cathode and the secondary cathode include a transparent conductive oxide (TCO) or a thin film metal material having a semi-transparent.

12. The lighting apparatus using an organic light emitting diode according to claim 1, wherein the primary cathode includes one of a transparent conductive oxide (TCO), a thin film metal material having a semitransparent, and the secondary cathode includes silver (Ag).

13. The lighting apparatus using an organic light emitting diode according to claim 1, wherein the encapsulating material includes:
   a multiple protective layer covering the substrate including the primary cathode and the secondary cathode; and
   a metal film or a barrier film attached to the multiple protective layer with an adhesive layer.

14. The lighting apparatus using an organic light emitting diode according to claim 13, wherein the multiple protective layers include a first inorganic layer, an organic layer on the first inorganic layer, and a second inorganic layer on the organic layer.

* * * * *